United States Patent
Candela et al.

(10) Patent No.: US 9,933,474 B2
(45) Date of Patent: Apr. 3, 2018

(54) PARTIAL DISCHARGE DETECTION APPARATUS AND METHOD

(75) Inventors: Roberto Candela, Milan (IT); Antonio Di Stefano, Milan (IT); Giuseppe Fiscelli, Milan (IT); Giuseppe Costantino Giaconia, Milan (IT)

(73) Assignee: PRYSMIAN S.P.A., Milan (IT)

( * ) Notice: Subject to any disclaimer, the term of this patent is extended or adjusted under 35 U.S.C. 154(b) by 201 days.

(21) Appl. No.: 14/407,295

(22) PCT Filed: Jun. 14, 2012

(86) PCT No.: PCT/EP2012/061274
§ 371 (c)(1),
(2), (4) Date: Feb. 24, 2015

(87) PCT Pub. No.: WO2013/185820
PCT Pub. Date: Dec. 19, 2013

(65) Prior Publication Data
US 2015/0160282 A1  Jun. 11, 2015

(51) Int. Cl.
*G01R 31/02* (2006.01)
*G01R 31/12* (2006.01)

(52) U.S. Cl.
CPC ....... *G01R 31/025* (2013.01); *G01R 31/1227* (2013.01); *G01R 31/1245* (2013.01); *G01R 31/1272* (2013.01)

(58) Field of Classification Search
CPC combination set(s) only.
See application file for complete search history.

(56) References Cited

U.S. PATENT DOCUMENTS 7,112,968 B1* 9/2006 Nishizawa ......... G01R 31/1272
324/536
7,183,774 B2 2/2007 Kuppuswamy
(Continued)

FOREIGN PATENT DOCUMENTS

CN 2748927 Y 12/2005
CN 101387684 A 3/2009
(Continued)

OTHER PUBLICATIONS

J P2010032450A English machine translation, available from JPO website.*
(Continued)

*Primary Examiner* — Minh Phan
(74) *Attorney, Agent, or Firm* — Finnegan, Henderson, Farabow, Garrett & Dunner, L.L.P.

(57) ABSTRACT

A partial discharge detection apparatus, includes: a support structure and a first antenna configured to receive electromagnetic signals at least partially associated with partial discharges of an electric object and generate a first electrical signal, the first antenna having a first receiving effective area for first receiving directions and a second antenna configured to receive electromagnetic noise signals and generate a second electrical signal, the first and second antennas being arranged to cause the second antenna to have a second receiving effective area for the first receiving directions smaller than the first receiving effective area. The apparatus further includes a first processing module configured to generate from the first and second electrical signals a difference electrical signal representing a difference between the first electrical signal and the second electrical signal.

23 Claims, 8 Drawing Sheets

(56) References Cited

U.S. PATENT DOCUMENTS

| | | | | |
|---|---|---|---|---|
| 7,714,796 B1* | 5/2010 | Schumacher | ........ | H01Q 11/083 343/872 |
| 2005/0001167 A1* | 1/2005 | Garmer | .................. | G08B 25/10 250/347 |
| 2007/0139056 A1 | 6/2007 | Kaneiwa et al. | | |
| 2008/0288189 A1 | 11/2008 | Rao et al. | | |
| 2009/0152352 A1* | 6/2009 | Hemmer | ............ | G06K 7/10207 235/439 |

FOREIGN PATENT DOCUMENTS

| | | |
|---|---|---|
| JP | 2007-27814 | 2/2007 |
| JP | 2010-032450 A | 2/2010 |
| WO | WO 2009/150627 | 12/2009 |

OTHER PUBLICATIONS

International Search Report from the European Patent Office for International Application No. PCT/EP2012/061274, dated Mar. 21, 2013.

Written Opinion of the International Searching Authority from the European Patent Office for International Application PCT/EP2012/061274, dated Mar. 21, 2013.

J. Lopez-Roldan et al.; "Optimisation of a Sensor for Onsite Detection of Partial Discharges in Power Transformers by the UHF Method", IEEE Transactions on Dielectrics and Electrical Insulation, vol. 15, No. 6, pp. 1634-1639, (2008).

* cited by examiner

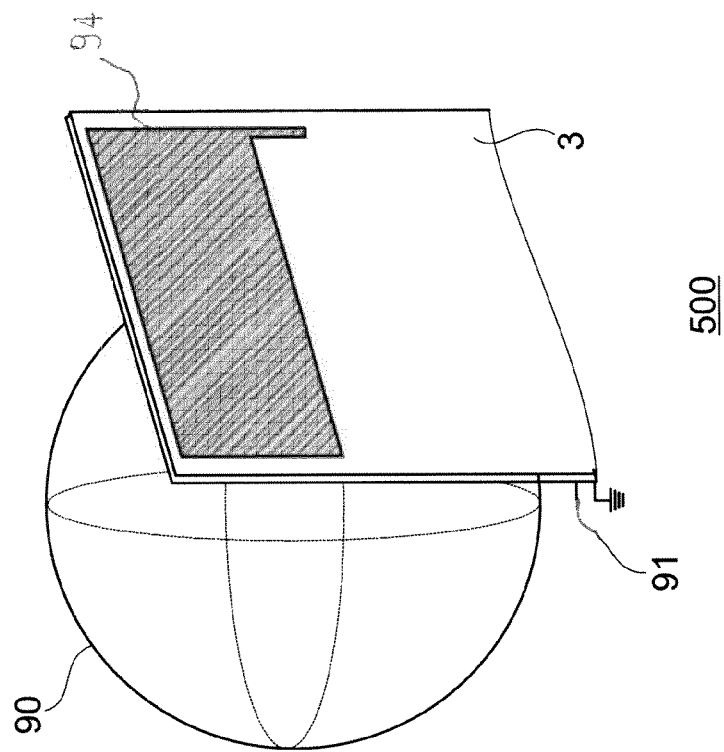
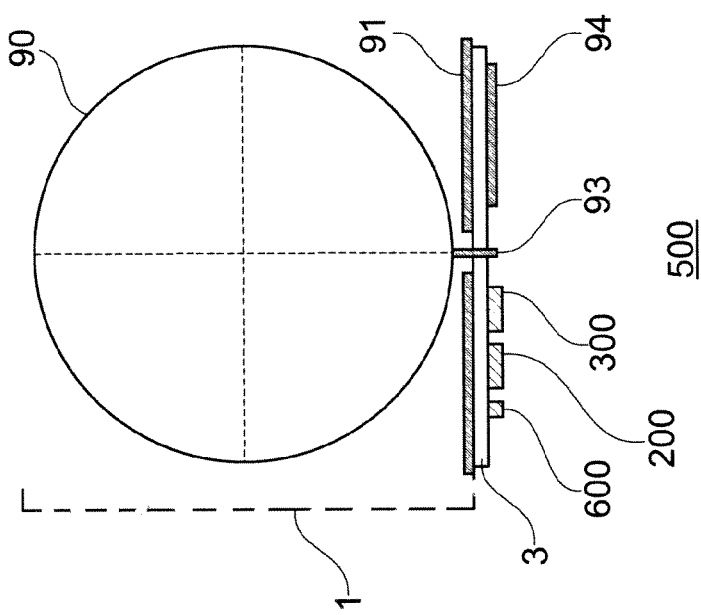
Fig. 8B
Fig. 8A

PARTIAL DISCHARGE DETECTION APPARATUS AND METHOD

CROSS REFERENCE TO RELATED APPLICATION

This application is a national phase application based on PCT/EP2012/061274, filed Jun. 14, 2012, the content of which is incorporated herein by reference.

BACKGROUND

Technical Field

The present invention relates to partial discharge detection techniques. Partial discharge detection is particularly used for detecting and measuring partial discharges in electrical components and apparatus, such as: medium or high voltage cables, cable joints, overhead line insulators, medium and high voltage switchboard boxes, high and extra-high voltage cables using GIS (Gas Insulated Switchgear).

Description of the Related Art

The term partial discharges is intended to indicate an undesired recombination of electric charges occurring in the dielectric (insulating) material of electric components, when the latter have defects of various types, eventually leading to dielectric destruction. Here, a pulse current is generated in portions of dielectric material and causes an electromagnetic wave to propagate through the power or ground cables of the relevant electric system, and radiating through the various surrounding media (dielectric material, metals, air, etc.).

Document WO-A-2009-150627 describes, inter alia, a partial discharge detection device of small size, totally insulated and self-powered, which allows measurements to be performed with the highest safety with no need for direct connection to the system under examination. The device comprises a wide-band antenna adapted to act as an electric field sensor and including a first planar conductor (i.e. a ground plane) cooperating with a second conductor whose profile converges towards the first planar conductor at one point or one line, said second conductor being smaller by about two orders of magnitude than the field wavelength to be detected, so that the wide-band antenna is non-resonant in a band from about 0.1 MHz to about 100 MHz. For example, the second conductor has the shape of a hollow sphere. An electronic wide-band amplifier can be used for adjusting the impedance of the antenna and amplifying the signals picked up for weak signal detection. The wide band amplifier has a minimum band falling in a range from about 0.5 MHz to 60 MHz. An off-band filtering is performed by first-order or second order filters having cut-off frequency of a few tens of MHz.

The Applicant has noticed that by performing a wireless and contactless detection a considerable amount of environmental noise is also received; this noise can be louder than small impulsive signals generated in an electrical component by partial discharge, so reducing the accurateness of the sensing method.

Document U.S. Pat. No. 7,183,774 discloses a method of detecting partial discharge in electrical appliance employing a UHF antenna placed in the receptacle of the appliance. The method consists of analysing the spectrum of the electromagnetic signal picked up by the antenna and of identifying within the spectrum one or more frequency of interest. To identify the frequency of interest, the spectrum of the signal received by the antenna is compared with a reference spectrum. The method includes a stage in which the amplitude difference between the two spectra is calculated for the maximum peak values and for the average values of the two available spectra at each frequency.

Document JP-A-07-027814 describes an insulating monitoring device for electric power equipment which monitors the insulated state of electrical equipment by monitoring the generation of corona discharge. The device is constituted of a corona detecting antenna which detects electromagnetic waves generated when corona discharge occurs in power equipment, a noise detecting antenna which detects external noise waves. Moreover, the device is also provided with a signal processing circuit for removing noise signals contained in the signal for corona detection. The processing circuit consists of two amplifiers and a differential amplifier.

BRIEF SUMMARY OF THE INVENTION

The Applicant has noticed that the technique described by the document JP-A-07-027814 does not ensure a satisfying noise cancellation. The Applicant has dealt with the problem of designing a partial discharge detection apparatus employing an antenna for picking up partial discharge signals that allows detection of partial discharge pulses having amplitude comparable to the amplitude of noise signals received at the same antenna.

The Applicant found that two antennas placed (in remote or near positions) in such a way that one antenna shows a respective effective area smaller than the effective area of the other antenna for supposed incoming directions of partial discharge signals could provide satisfying values of the signal-to-noise ratio S/N. In particular the signal of the antenna oriented toward the supposed partial discharge source is subtracted of the signal of the second antenna.

According to a first aspect, the present invention relates partial discharge detection apparatus comprising:

a first antenna configured to receive electromagnetic signals at least partially associated with partial discharges of an electric object and to generate a first electrical signal; the first antenna having a first receiving effective area for first receiving directions;

a second antenna configured to receive electromagnetic noise signals and to generate a second electrical signal; the first and second antennas being arranged to cause the second antenna to have a second receiving effective area for said first receiving directions smaller than said first receiving effective area; and a first processing module configured to receive said first and second electrical signals and to generate a difference electrical signal representing the difference between the first electrical signal and the second electrical signal.

Advantageously, at least one of the first antenna and the second antenna is a directional antenna. Preferably both the first antenna and the second antenna are directional antennas.

Advantageously, the first and the second antenna are placed on a shared support structure. The shared support structure can be a portion of one of the first or second antenna.

Preferably, in the apparatus of the invention the first antenna has a third effective area for second receiving directions, different from said first receiving directions; and the second antenna has a fourth effective area for second receiving directions, said fourth effective area being equal or larger than the third effective area. In this way, the second antenna is more noise-sensitive than the first antenna.

Preferably, in the apparatus of the invention the first antenna is arranged, for example on a support structure, so as to have at least 90% of the received power in a first radiation pattern included in a first half-space; and the second antenna is arranged, for example on the same support structure, so as to have at least 90% of the received power in a second radiation pattern included in a second half-space opposite to the first half-space with respect to a reference plane separating the first half-space from the second half-space.

More preferably, the first antenna is arranged, for example on a support structure, to show maximum values of the respective reception gain for incoming directions lying on the first half-space, and the second antenna is arranged, for example structured and mounted on the same support structure, to show maximum values of the respective reception gain for further incoming directions lying on the first half-space.

In the case both the first antenna and second antenna are directional and have substantially non overlapping receiving diagrams, the first antenna preferably includes a first antenna conductor and a planar conductor configured to operate as ground plane for the first antenna conductor.

Preferably the first antenna has spherical shape.

Preferably the second antenna is a patch or loop antenna.

In an embodiment of the present invention, the shared support structure of the apparatus of the invention comprises a planar portion including: a first side on which is mounted the first antenna conductor and a second side opposite to the first side on which said second antenna conductor is mounted.

Preferably, the support structure comprises a printed circuit board including the first processing module.

Preferably, the printed circuit board comprises electrical terminals connected to the first antenna and the second antenna, and a support element mechanically connecting the first antenna conductor to the printed circuit board.

Preferably, the first processing module of the apparatus of the invention comprises a difference module configured to generate said difference electrical signal. The difference module can be selected from an active electronic component, a voltage transformer or a center-tapped voltage transformer.

In the presence of a difference module, the first antenna is structured to detect by capacitive coupling a synchronization electrical signal representing the trend of the electrical voltage supplied to the electrical object.

Advantageously, the apparatus of the invention further includes a synchronization module configured for amplifying said synchronization electrical signal and providing an amplified synchronization electrical signal.

In a preferred embodiment said first processing module further comprises a first high pass filtering module connected to the first antenna, and a second high pass filtering module connected to the second antenna, the first and second high pass filtering modules being configured to decouple the synchronization electrical signal from said first and second electrical signals.

In the case the difference module is an active electronic component, said active electronic component comprises an operational amplifier in a non-inverting negative feedback configuration. The operational amplifier advantageously comprises a non-inverting terminal configured to receive said first electrical signal; an inverting terminal configured to receive said second electrical signal; and an output terminal configured to provide the difference electrical signal representing the difference between the first electrical signal and the second electrical signal.

In another embodiment of the invention, the apparatus further includes an acquisition and analysis device comprising: a digital-to-analog converter structured to produce from the difference electrical signal a plurality of corresponding samples; an acquisition trigger module to select acquisition samples from said plurality of samples; a memory configured to store the selected acquisition samples; a processor structured for generating command signals to be sent to the acquisition trigger module and the memory.

Preferably, the measuring module is structured to receive amplified synchronization electrical signal from a synchronization module and to provide electrical parameters to the processor.

The acquisition and analysis device preferably further includes a transceiver module structured to send/receive data/command to/from an external processor module.

In a preferred embodiment, the apparatus of the invention has the first antenna configured to receive signals having frequency included in the range 0.1 MHz-100 MHz and the second antenna configured to receive signals having frequency included in the range 0.1 MHz-100 MHz.

In another aspect, the present invention relates to a partial discharge detection method, comprising:

positioning a first directional antenna to have a first receiving effective area for first receiving directions;

receiving by the first antenna electromagnetic signals at least partially associated with partial discharges of an electric object;

generating by the first antenna a first electrical signal corresponding to the received electromagnetic signals;

positioning a second directional antenna to have a second receiving effective area for said first receiving directions smaller than said first receiving effective area;

receiving by the second antenna electromagnetic noise signals;

generating by the second antenna a second electrical signal corresponding to said received electromagnetic noise signals;

processing said first and second electrical signals to produce a difference electrical signal representing a difference between the first electrical signal and the second electrical signal.

In the present description and claims, as "directional antenna" is meant an antenna radiating or receiving electromagnetic waves more effectively in some directions than others. In particular, as "directional antenna" it is meant an antenna having a Front/Back ratio greater than 0 dB, preferably greater than 1 dB. The Front/Back parameter, expressed in decibel, is the ratio between the gain parameter associated with the main lobe of the radiation pattern and the gain parameter associated with the opposite lobe of the radiation pattern. The gain parameter of an antenna is the ratio of the power produced by the antenna from a far-field source on the antenna's beam axis to the power produced by a hypothetical lossless isotropic antenna, which is equally sensitive to signals from all directions.

In the present description and claims, with reference to antenna, as "receiving direction of signals" or "incoming direction of signals" is meant the direction which the signals are assumed to come from.

In the present description and claims, as "effective area" of an antenna is meant a measure of how effective an antenna is at receiving the power of electromagnetic waves at each incoming direction. The effective area of an antenna is dependent on another parameter characterizing the antenna behaviour which is the directivity of the antenna. In the present description the terms "effective area" and "directivity" will be both used as alternative parameters characterizing the capability of receiving power from particular incoming direction of an antenna.

BRIEF DESCRIPTION OF THE DRAWINGS

Further characteristics and advantages will be more apparent from the following description of a preferred embodiment and of its alternatives given as a way of an example with reference to the enclosed drawings in which:

FIGS. 8A and 8B show two different views of a particular embodiment of said partial discharge acquisition system;

DETAILED DESCRIPTION

Figure 1:
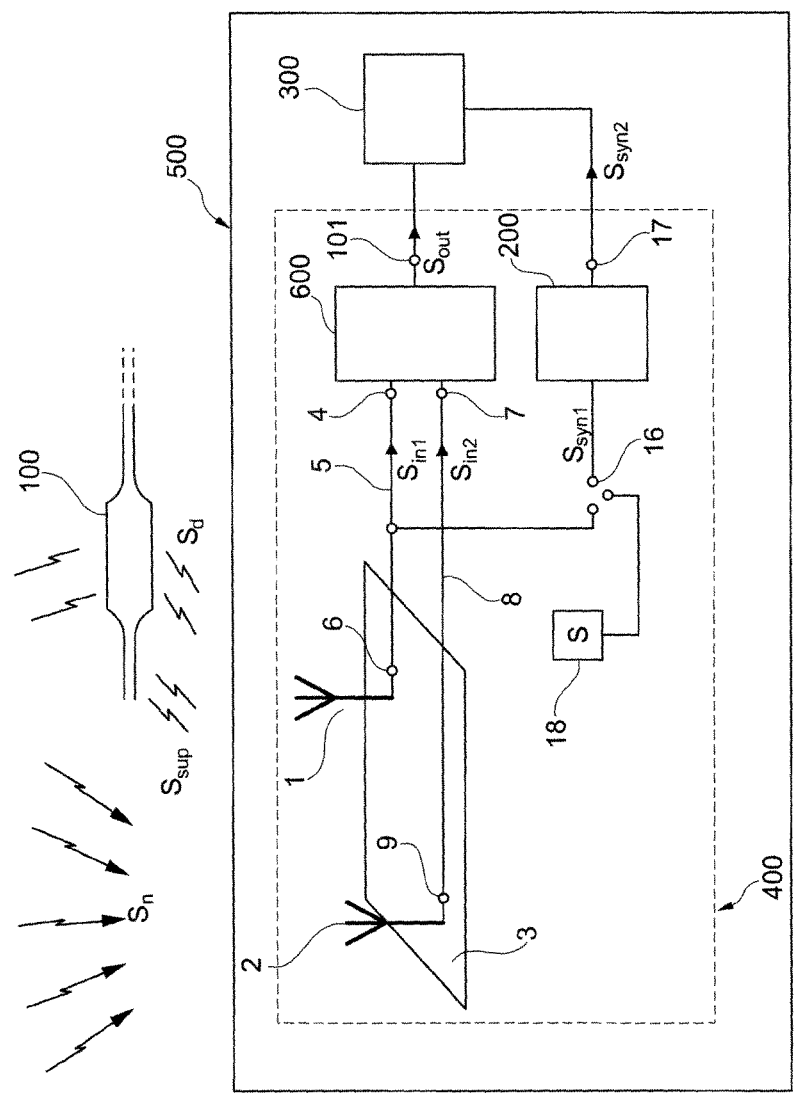
FIG. 1 shows an embodiment of a partial discharge acquisition system comprising a first antenna, a second antenna and a difference module.

FIG. 1 shows an electrical object 100 and a partial discharge acquisition system 500 comprising a partial discharge detection apparatus 400 and an optional acquisition and analysis device 300.

The electrical object 100 can be any kind of component, device, apparatus or system which can produce partial discharge electromagnetic pulses and is, as an example: a medium or high voltage cable, a cable joint, an overhead line insulator, a medium or high voltage switchboard box, a high and extra-high voltage cable using GIS (Gas Insulated Switchgear), an electric motor or generator or a medium or high voltage transformer.

The partial discharge acquisition system 500 is an electronic apparatus employable to detect, measure and/or analyse partial discharges generated by electrical sources as the electrical object 100. Particularly, the partial discharge acquisition system 500 can be portable and is included in a case not shown in the figures.

The partial discharge acquisition system 500 is configured to be placed in proximity of the electrical object 100 to receive, according to a wireless and contactless mode, discharge electromagnetic signals Sd corresponding to partial discharge pulses emitted by the electrical object 100. It is also observed that electromagnetic noise signals Sn which could disturb the detection of the electromagnetic signals corresponding to the partial discharge pulses can be present in the area in which the partial discharge acquisition system 500 is employed.

The discharge signals Sd to be detected can be electromagnetic wave pulses having frequencies included in the range 0.1 MHz to 100 MHz. The noise signals Sn have typically frequencies included in the same range 0.1 MHz to 100 MHz.

The partial discharge detection apparatus 400 (hereinafter also called "detection apparatus", for the sake of conciseness) comprises a first antenna 1 and a second antenna 2 which can both be mounted, as an example, on a shared support structure 3, in accordance with a first embodiment of the invention. The first antenna 1 is configured to receive the discharge signals Sd, but can also receive unwished electromagnetic noise signals Sn.

In greater detail, with reference to a first set of incoming directions of the radiation, the first antenna 1 is structured to show a first effective area $Aeff_1$ having a first value or values $Aeff_{1\text{-}dr1}$. Particularly, the first set of incoming directions corresponds to the incoming directions of the discharge signals Sd.

The second antenna 2 is configured to receive the electromagnetic noise signals Sn present in the area in which the partial discharge acquisition system 500 is employed. In some cases, the second antenna 2 can also receive discharge signals Sd. However, the second antenna 2 is structured to show a second effective area $Aeff_2$ that, for said first set of incoming radiation directions, has a second value or values $Aeff_{2\text{-}dr1}$ which is smaller than said first value $Aeff_{1\text{-}dr1}$ of the first antenna 1:

$$Aeff_{1\text{-}dr1} > Aeff_{2\text{-}dr1} \tag{1}$$

Particularly, the first value $Aeff_{1\text{-}dr1}$ is at least ten times the second value $Aeff_{2\text{-}dr1}$.

The relation (1) for the first set of incoming radiation directions means that the first antenna 1 is more sensitive to the discharge signals Sd than the second antenna 2.

With reference to a second set of incoming radiation directions, the first antenna 1 shows a first effective area $Aeff_1$ having third value or values $Aeff_{1\text{-}dr2}$ and the second antenna 2 shows a second effective area $Aeff_2$ having fourth value or values $Aeff_{2\text{-}dr2}$. Particularly, the second set of incoming directions corresponds to the incoming directions of the electromagnetic noise signals Sn.

In accordance with a particular embodiment, the partial discharge detection apparatus 400 is configured so that the following relation is valid for the first and second antenna 1 and 2, with reference to the second set of incoming directions:

$$Aeff_{2\text{-}r2} \geq Aeff_{1\text{-}dr2} \tag{2}$$

According to relation (2) the fourth value/s $Aeff_{2\text{-}dr2}$ are equal or larger than the third value/s $Aeff_{1\text{-}dr2}$. Particularly, the fourth value $Aeff_{2\text{-}dr2}$ is at least ten times the third value/s $Aeff_{1\text{-}dr2}$.

The relation (2) for the second set of incoming radiation directions means that the second antenna 2 is equally or more sensitive to the electromagnetic noise signals Sn than the first antenna 1.

In accordance with a first example, the first antenna 1 and/or the second antenna 2 are directional antennas. Particularly, the first antenna 1 and the second antenna 2 show different three dimensional radiations patterns. Particularly, the partial discharge detection apparatus 400 is designed in such a way that the first antenna 1 can provide a sensitive and accurate detection of the discharge signal Sd, so the first antenna 1 is designed in order to obtain that the first effective area $Aeff_1$ shows a largest value for the first set of incoming directions.

Moreover, the partial discharge detection apparatus 400 is designed in such a way that the second antenna 2 can provide detection of the noise signals Sn, so the second antenna 2 is designed in order to obtain that the second effective area $Aeff_2$ shows a largest value for the second set of incoming directions.

Preferably, the first antenna 1 has a directivity having a Front/Back parameter comprised between 3 and 30 dB; more preferably the Front/Back parameter is comprised between 6 dB and 10 dB. The second antenna 2 has a directivity having a Front/Back parameter greater than the Front/Back parameter of the first antenna 1 and, preferably, comprised between 10 and 30 dB; more preferably the Front/Back parameter of the second antenna 2 is comprised between 11 and 20 dB.

As an example, the first antenna 1 can be one of the following antennas: small patch antenna, loop antenna, dipole and ultra wideband antenna. A particular spherical antenna which can be used as the first antenna 1 will be described hereinafter.

The second antenna 2 can be, as an example a patch antenna, a loop antenna, a dipole, a ultra wideband antenna or a spherical antenna analogously to the first antenna 1. According to the first embodiment represented in FIG. 1, the partial discharge detection apparatus 400 further comprises a difference module 600 having a first input terminal 4 connected, by means of a first conductive line 5, to a first output terminal 6 of the first antenna 1 and a second input terminal 7 connected, by means of a second conductive line 8, to a second output terminal 9 of the second antenna 2.

Moreover, the first antenna 1 is configured to receive the discharge signals Sd and the unwanted noise signal Sn and convert them into a first received electrical signal Sin1 (e.g. an electrical current) available on the first conductive line 5. The second antenna 2 is configured to receive the noise signal Sn and also a part of the discharge signals Sd and convert them into a second received electrical signal Sin2 (e.g. a further electrical current) available on the second conductive line 8.

Figure 4:
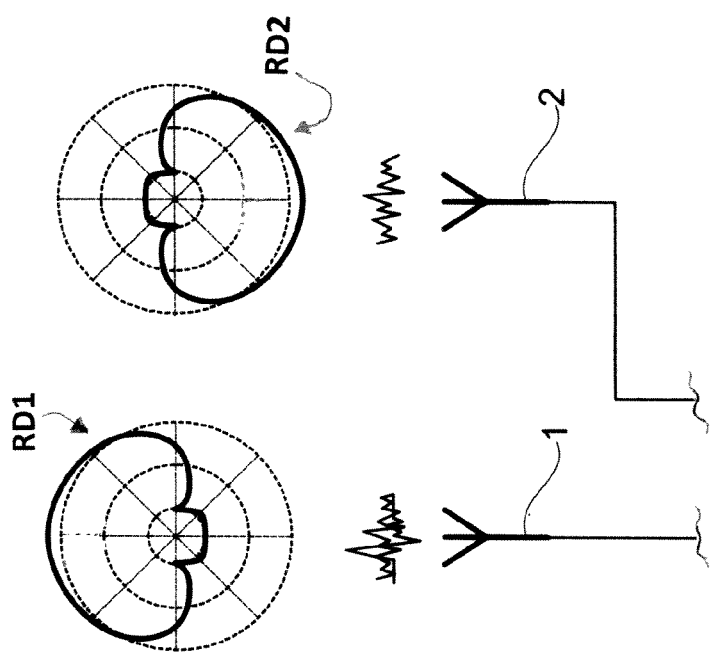
FIG. 4 shows a first radiation diagram of the first antenna and a second radiation diagram of the second antenna.

FIG. 4 show, as an example, a first radiation diagram RD1 of the first antenna 1 and a second radiation diagram RD2 of the second antenna 2, as they could be when the first antenna and the second antenna 2 are positioned to operate for the detection. Particularly, FIG. 4 shows a vertical section of a first radiation pattern of the first antenna 1 and another vertical section of a second radiation pattern of the second antenna 2. A vertical section is a section between a vertical plane, as an example a plane perpendicular to the ground surface, and the respective pattern. As clear to the man skilled in the art, the radiation diagram of an antenna is substantially identical to the reception diagram of the same antenna. In accordance with the example shown in FIG. 4, the first diagram RD1 substantially lies in a first half-space while the second diagram RD2 substantially lies in the opposite half-space, with respect to a reference plane, e.g. parallel to a ground surface.

Particularly, the first radiation pattern of the first antenna 1 and the second radiation pattern of the second antenna 2 substantially do not overlap each other and, particularly, the first antenna 1 shows maximum values of the reception gain for incoming directions lying in the first half-space (to be oriented toward the expected partial discharge source). The second antenna 1 shows maximum values of the reception gain for incoming directions lying in the second half-space which is opposite to the first half-space.

Preferably, the first antenna 1 is arranged on the support structure 3 so as to have at least 90% of the received power of the first radiation pattern included in the first half-space, and the second antenna 2 is arranged on the support structure 3 so as to have at least 90% of the received power of the second radiation pattern included in a second half-space opposite to the first half-space. As an example, the first antenna 1 and the second antenna 2 both show a Front/Back parameter of 20 dB and, particularly they are oriented in different and, preferably, opposite directions.

The difference module 600 of FIG. 1 is configured to generate a difference output signal Sout representing a difference between the first electrical received signal Sin1 and the second electrical received signal Sin2. The difference module 600 is provided with a third output terminal 10 for the difference output signal Sout.

Figure 2:
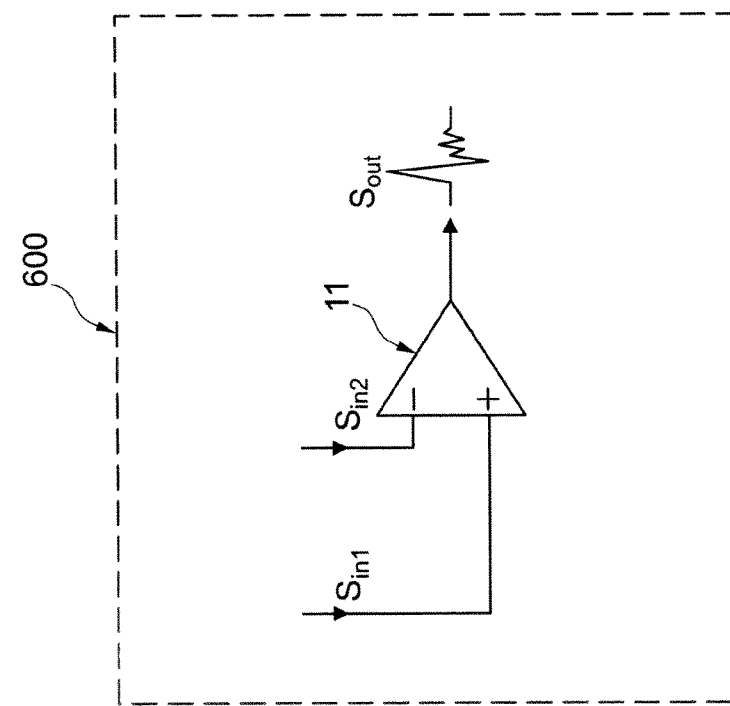
FIG. 2 schematically shows an active electronic component employable by said difference module.

According to an example shown in FIG. 2, the difference module 600 can comprise an active electronic device, such as an operational amplifier 11 or another type of discrete electronic active component, adapted to generate the difference output signal $S_{out}$. A particular embodiment of the difference module 600 employing the operational amplifier 11 will be described hereinafter.

Figure 3:
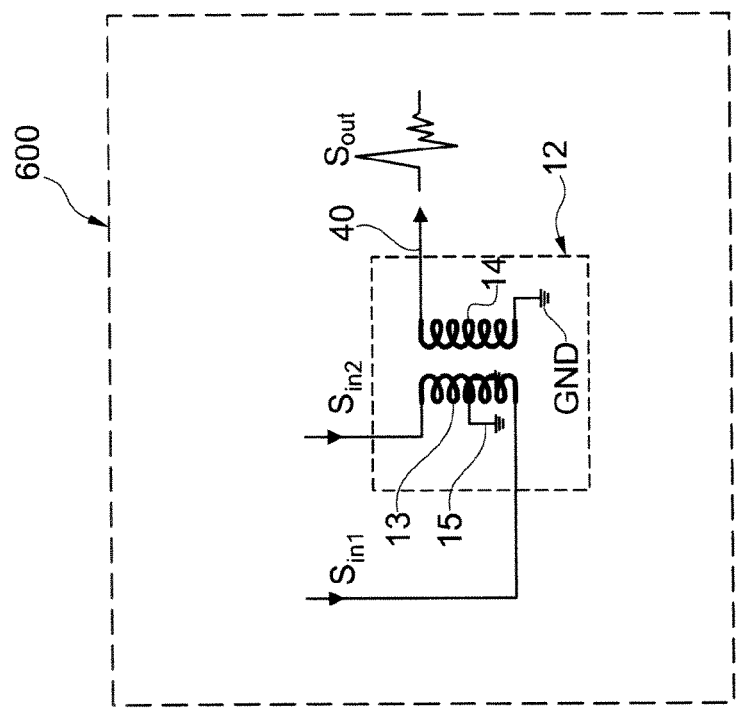
FIG. 3 schematically shows a center tapped primary voltage transformer employable by said difference module.

In accordance with another example shown in FIG. 3, the difference module 600 can comprise a passive electronic device, such as an electrical transformer 11, adapted to generate the difference output signal $S_{out}$. The electrical transformer 12 is a high frequency transformer. In accordance with the example shown in FIG. 3, the high frequency transformer 12, which is in a central tapped configuration, includes a first winding 13 having two end terminals adapted to respectively receive the first electrical received signal Sin1 and the second electrical received signal $S_{in2}$ and a central terminal 15 connected to an electrical ground terminal GND. A second winding 14 of the high frequency transformer 12 is mutually coupled with the first winding 13 and is provided with a difference signal terminal 40 for the difference output signal $S_{out}$ and a ground terminal GND connected to the electrical ground.

In accordance with the embodiment shown in FIG. 1, the partial discharge detection apparatus 400 can be also provided with a synchronization module 200 which is configured to receive at a third input terminal 16 a first synchronization electrical signal $S_{syn1}$ and provide on a fourth output terminal 17 a second synchronization electrical signal $S_{syn2}$. The first synchronization electrical signal $S_{syn1}$ represents the behaviour of the AC (Alternate Current) electrical voltage supplied to the electrical object 100 under test and can be obtained, in accordance to one embodiment, by a wireless and contactless detection performed by the first antenna 1 of a supply electromagnetic signal $S_{sup}$ generated by the electrical voltage passing through the electrical object 100. According to this embodiment, the third input terminal 16 is connected to the first connection line 5 to receive the first received electrical signal $S_{in1}$ also including the first synchronization electrical signal $S_{syn1}$ and, particularly, the first antenna 1 is designed to operate as a capacitive coupling sensor to detect the first synchronization electrical signal $S_{syn1}$ from the supply electromagnetic signal $S_{sup}$. In this case, the first antenna 1 is designed to offer a suitable capacitive coupling with the AC (Alternate Current) electrical voltage feeding the electrical object 100 showing, as an example, a suitable coupling surface.

In accordance with another embodiment, the first synchronization electrical signal Ssyn1 can be detected by a synchronization sensor 18 connectable to the third input terminal 16, such as a further antenna for a wireless and contactless detection, or another type of sensor to be put into contact with the electrical object 100 or with another electrical component operating at the same electrical voltage supplied to the electrical object 100.

With reference to the difference module 600, in accordance with another embodiment, it can also be structured to suitably treat the first received electrical signal Sin1 and the second received electrical signal $S_{in2}$ and so it can also comprises a high pass filtering module and optional equalization module placed before the operational amplifier 11 or the electrical transformer 12.

Figure 5:
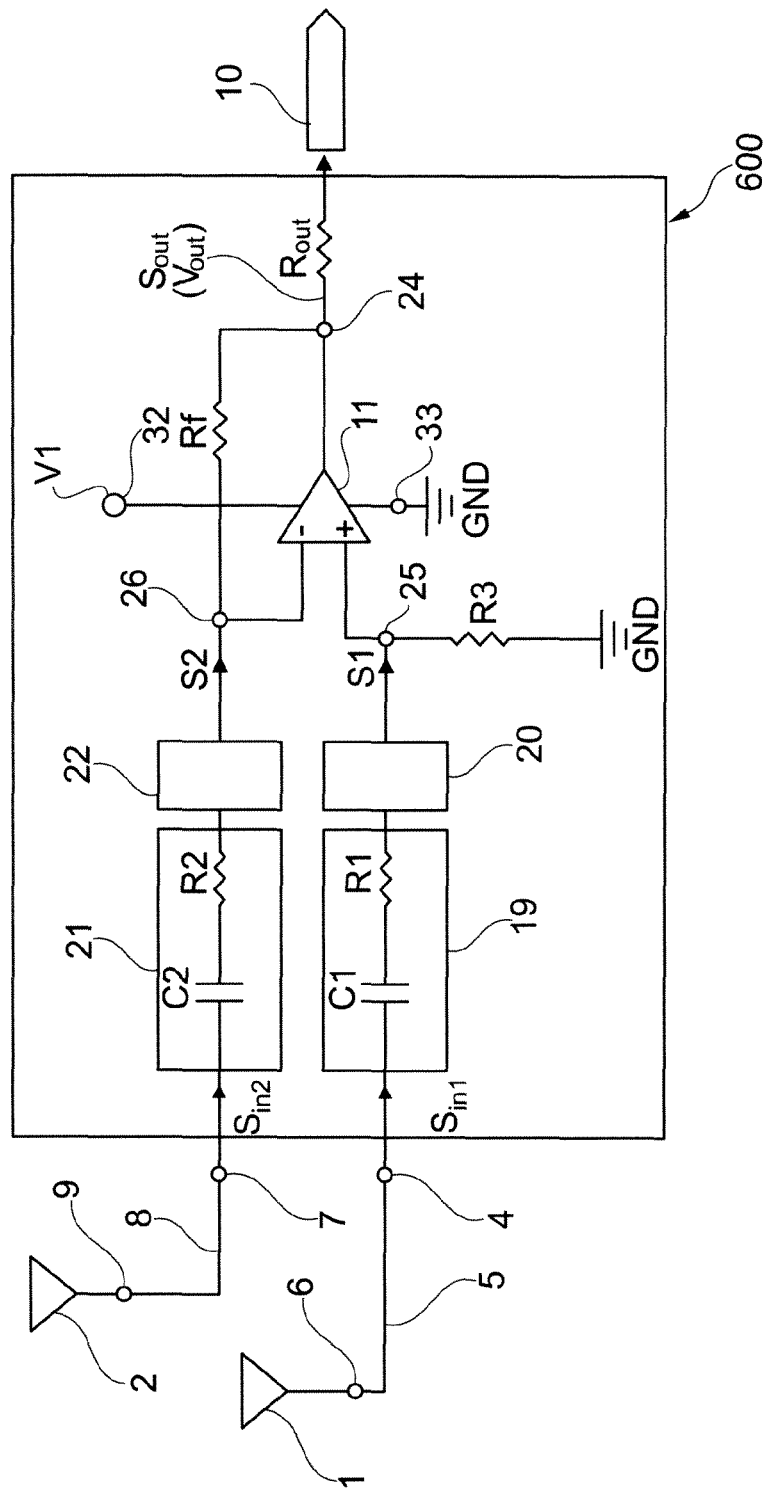
FIG. 5 is an embodiment of the difference module employing an operational amplifier.

FIG. 5 refers to an example of the difference module 600 in the case in which the operational amplifier 11 is employed. The difference module 600 comprises a first high pass filtering module 19 having a respective input connected to the first input terminal 4. As an example, the first high pass filter module 19 can include a first capacitor C1 connected in series with a first resistor R1. An output of the high pass filter module 19 is connected to an optional first equalization module 20 which is also connected to an non-inverting terminal "+" of the operational amplifier 11 via a first node 25. The first node 25 is connected to a third resistor R3 which is also connected to the ground terminal GND.

The difference module 600 of FIG. 5 also comprises a second high pass filter module 21 having a respective input connected to the second input terminal 7. As an example, the second high pass filter module 21 can include a second capacitor C2 connected in series with a second resistor R2. The first and second high pass filter modules 19 and 21 are structured to decouple the first synchronization electrical signal $S_{syn1}$, at lower frequency, from the first and second received electrical signals $S_{in1}$ and $S_{in2}$, respectively.

An output of the second high pass filter module 21 is connected to an optional second equalization module 22 which is also connected to an inverting terminal "−" of the operational amplifier 11 via a second node 26. The operational amplifier 11 is provided with: a first supply terminal 32 for a supply voltage V1, a second supply terminal 33 connected to a ground terminal GND and the fifth output terminal 24 for the difference output signal $S_{out}$, which can be an output voltage Vout. The fifth output terminal 24 is connected to the third output terminal 10 by a output resistor Rout.

The output voltage Vout is given by the difference of voltages applied to the non-inverting terminal "+" and the inverting terminal "−" multiplied by a gain factor $A_{op}$ of the operational amplifier 11. Particularly, the operational amplifier 11 is configured to show a bandwidth at least including the bandwidth of the first antenna 1 such as an example, a bandwidth ranging from 0.1 MHz to 100 MHz. The operational amplifier 11 can include one or more differential amplifiers each realized by means of transistors pair in differential configuration. A plurality of amplification stages can be included in the operational amplifier 11 to reach a wished amplifier gain. The first resistor R1, the second resistor R2 and the feedback resistor Rf show values of the respective resistances which can be chosen to design the gain factor $A_{op}$ of the operational amplifier 11 and to match the impedances of the first antenna 1 and the second antenna 2, respectively.

Moreover, in accordance with a particular embodiment, the operational amplifier 11 is in the non-inverting negative feedback configuration and a feedback resistor Rf is connected between the fifth output terminal 24 and the second node 26 connected in turn to the inverting terminal "−". The negative feedback configuration allows obtaining a predictable behavior of the difference module 600. The first equalizer 20 and second equalizer 21 can be employed to compensate a possible difference of the frequency responses of the first antenna 1 and the second antenna 2.

In operation, the first antenna 1 is employed simultaneously with the second antenna 2. The first antenna 1 picks up, in accordance with its effective area diagram, the discharge signal $S_d$, the noise signal $S_n$ contribution and the supply electromagnetic signal $S_{sup}$ and generates the first received electrical signal $S_{in1}$. The second antenna 2 picks up, in accordance with the respective effective area diagram, the noise signal $S_n$ and part of the discharge signal $S_d$ and generates the second received electrical signal $S_{in2}$. The second antenna 2 can also pick up the supply electromagnetic signal $S_{sup}$.

The first received electrical signal Sin1 and second received electrical signal Sin2 are fed to the difference module 600. With reference for example, to the embodiment of FIG. 5, the first received electrical signal Sin1 and second received electrical signal Sin2 are filtered respectively by the first high-pass filtering module 19 and the second high-pass filtering module 21. The optional first and second equalization modules 20 and 22 act on the first received electrical signal Sin1 and second received electrical signal $S_{in2}$ to equalize the frequency response difference of the first and second antennas 1 and 2 and obtain a first input signal $S_1$ and a second input signal $S_2$.

It is noticed that thanks to the above described conditions about the effective areas of the first antenna 1 and the second antenna 2, the first input signal S1 carries a discharge signal $S_d$ contribution greater than the discharge signal $S_d$ contribution carried by the second input signal $S_2$ which substantially represents the noise $S_n$ contribution.

The first input signal $S_1$ is fed to the non-inverting terminal "+" and the second input signal $S_2$ is fed to the inverting terminal "−" of the operational amplifier 11. The operational amplifier 11 performs a difference between the first input signal $S_1$ and the second input signal $S_2$ generating the output different signal $S_{out}$ in which the noise contribution is reduced or substantially removed. The operational amplifier 11 allows to subtract the noise contribution present in the second input signal $S_2$ from the first input signal $S_1$.

Figure 6:
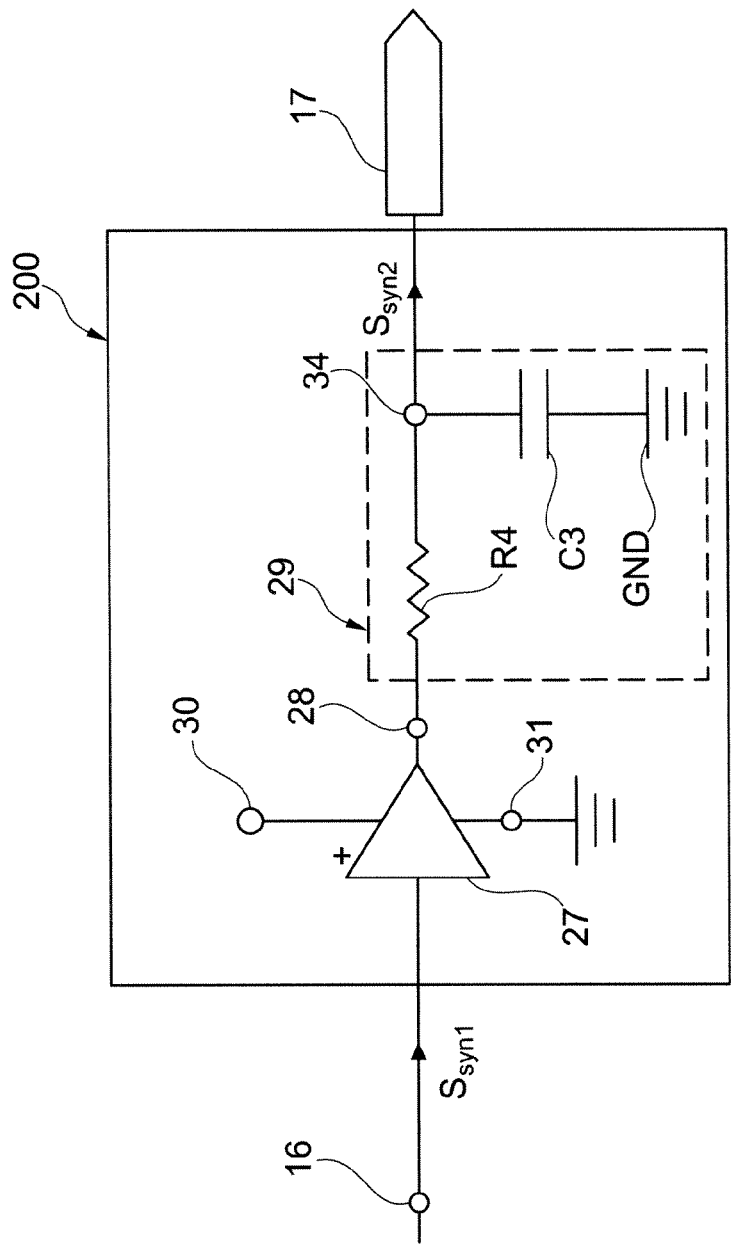
FIG. 6 shows an embodiment of a synchronization module included in said partial discharge acquisition system.

FIG. 6 shows an embodiment of the synchronization module 200 comprising an amplifier module 27, such as a high gain buffer amplifier, having an input connected the third input terminal 16 and a sixth output terminal 28 connected to a low pass filter module 29. The high gain buffer amplifier 27 is also provided with a third supply terminal 30 for the supply voltage V1 and a fourth supply terminal 31 connected to the ground terminal GND. As an example, the high gain buffer amplifier 27 is a voltage amplifier and has a gain greater than 100. Moreover, the high gain buffer amplifier 27 shows an input-output impedance >1 MOhm and can have an overall bandwidth lower than 1 kHz. The low pass filter module 29 includes, as an example, a fourth resistor R4 connected between the sixth output terminal 28 and a third node 34 and a third capacitor C3 connected between the third node 28 and the ground terminal GND. The third node 34 is connected to the fourth output terminal 17.

Figure 7:
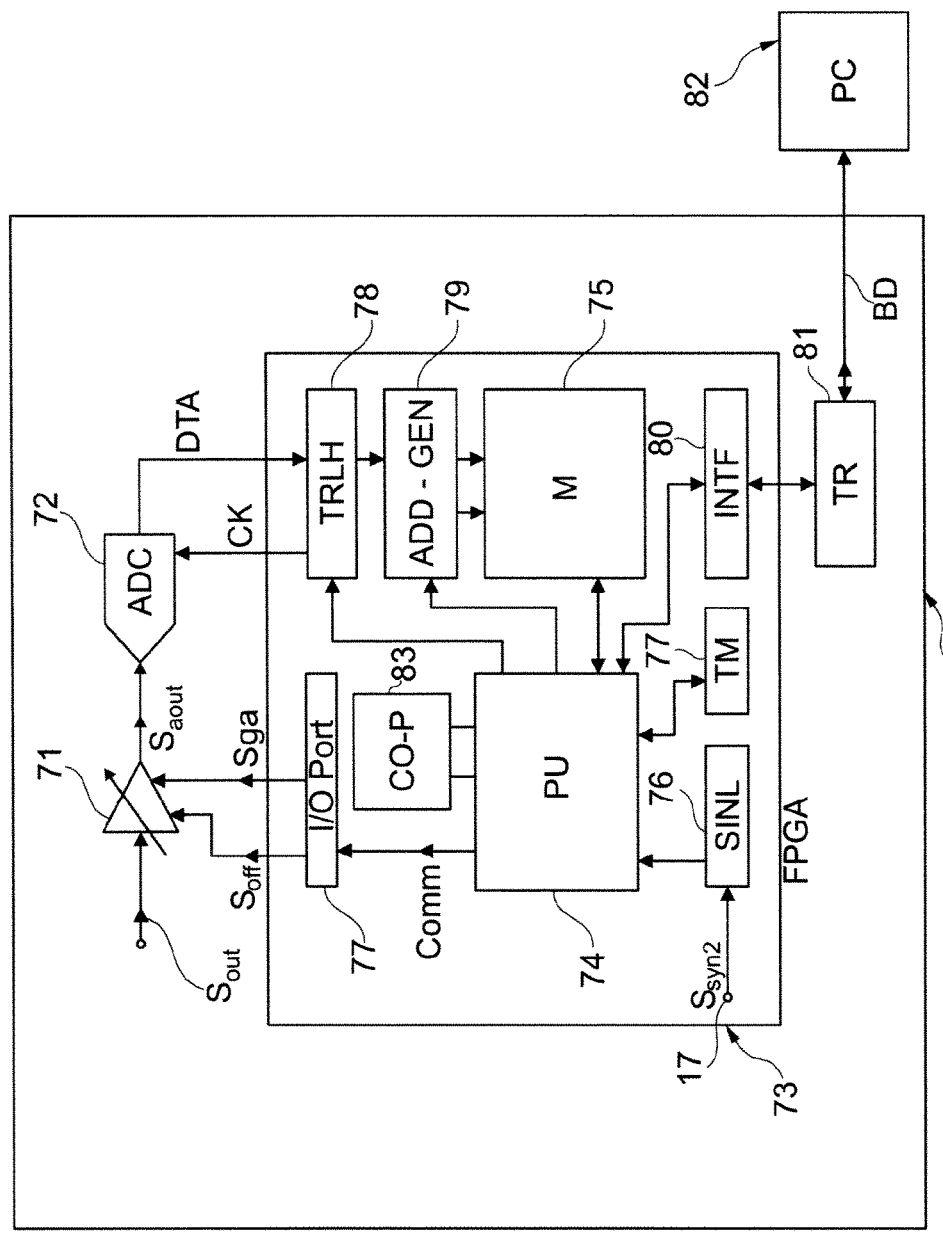
FIG. 7 shows an embodiment of the acquisition and analysis device included in said partial discharge acquisition system.

The acquisition and analysis device 300 can be included in a housing also containing the partial discharge detection apparatus 400 or can be included in a separated housing. FIG. 7 schematically shows an embodiment of the acquisition and analysis device 300 comprising an optional wide band programmable amplifier 71 (PGA) having an input connected to the third output terminal 10 of the difference module 600 and a respective output connected to an analog-to-digital converter 72. The acquisition and analysis device 300 also includes a control module 73 such a Field Programmable Gate Array (FPGA) which is structured to control the wide band programmable amplifier 71 and receive data from the analogical-to-digital converter 72 (ADC). The wide band programmable amplifier 71 can be programmed to impart to the difference output signal $S_{out}$ an offset value and an amplification gain value by means of offset signal $S_{off}$ and a gain signal $S_{ga}$ provided by the control module 73, so producing an amplified output signal $S_{aout}$.

The wide band programmable amplifier 71 allows, as an example, a continuous gain variation ranging from about −5 dB to +40 dB. The analogic-to-digital converter 72 is structured to be synchronised by a clock signal CK generated by the control module 73 and generate converted data DTA to be sent to the control module 73. The analogy-to-digital converter is, as an example, capable of converting 250 mega-samplers per second with an 8 bit resolution. This sampling frequency allows to acquire the difference electrical signal $S_{out}$ with a time resolution of 4 ns. It is observed that most partial discharge pulses are usually longer that 0.5 μs, the acquisition and analysis device 300 allows to acquire the pulse waveform and represent it with a number of samples comprised between 100 and 200.

Particularly, the control module 73 includes a processing unit 74 (PU), such as a microprocessor, and a memory 75 (M), such as a RAM (Random Access Memory). More particularly, the memory 75 can be a circular buffer. The processing unit 74 is connected to: a timing module 77 (TM) and synchronization logic module 76 (SINL) configured to receive the second synchronization electrical signal $S_{syn2}$. The synchronization logic module 76 is structured to measure the phase of the second synchronization electrical signal $S_{syn2}$ and transfer this measured value to the processing unit 74.

Moreover, an input/out port 77 allows to transfer output commands Comm generated by the processing unit 74 to the wide band programmable amplifier 71 under the form of the offset signal $S_{off}$ and the gain signal $S_{ga}$. The control module 73 is also provided with a trigger module 78 (TRLM) and by an address generation module 79 (ADD-GEN) configured to generate the addresses necessary to write new data in the memory 75 and read data stored in the memory 75, under the control of the processing unit 74.

The trigger module 78 is configured to trigger the memorisation of samples of the amplified output signal $S_{aout}$ exiting the wide band programmable amplifier 71 only for selected values of the amplified output signal $S_{aout}$ such as, for example, only for positive or negative pulses having amplitude (i.e. an absolute value) greater than a threshold level. The trigger logic module 78 can be a logic module comprising one or more analogical comparators to compare the values of the samples provided by the analog-to-digital converter with one or more thresholds.

Moreover, the control module 73 comprises a host interface module 80 (INTF) allowing data transfer to a transceiver 81 (TR), such as an example a US/Ethernet transceiver, which is configured to exchange data/commands with a further processor 82 (as an example, external to acquisition system 500) by a wired or wireless connection line BD. The external processor is configured to perform processing an analysis of the received data allowing, for example, representation of the discharge pulse behaviour on a monitor or memorization for subsequent processing and consulting.

The control module 73 can be also provided with an extraction module 83 (e.g. a co-processor CO-P) connected to the processing unit 74 which is configured to perform extraction, particularly, real-time extraction of pulse features from the data store in the memory 79. Examples of possible pulse features extracted by the co-processor are: peak value and polarity, phase, energy, duration and rough estimation of Weibull parameters.

In the operation of the control module 73, the acquisition is started and the processing unit 74 generates a signal activating the trigger module 78 which produces a trigger signal allowing the storing of the selected samples, by reading phase angle of the samples of the amplified output signal $S_{aout}$ with respect to the second synchronization signal $S_{syn2}$. The collected data can be sent to the external processor 82.

The partial discharge acquisition system 500 can also include one or more batteries for supply electrical voltage to the above described modules.

FIGS. 8A and 8B show two different views of a preferred embodiment of the partial discharge acquisition system 500 as realized by the Applicant and comprising particular embodiments of the first antenna 1, the second antenna 2 and the support structure 3. In greater detail, the first antenna 1 is a directional antenna and, particularly, is a wideband, non resonant antenna comprising a first antenna conductor 90 and a planar conductor 91 acting as a ground plane. The first antenna conductor 90 is electrically isolated with respect the planar conductor 91 and they operate poles of the first antenna 1. Particularly, the first antenna conductor 90 is spherical shaped and includes a hollow sphere in electrically conducting material such as, an example, metal or polymer material. The spherical shaped first antenna conductor 90 shows, as an example, a diameter comprised between 3 and 30 cm, preferably comprised between 5 and 20 cm.

The first antenna conductor 90 is supported by an insulated support 93 which is fixed on the support structure 3 which is, according to the example made, a printed circuit board (PCB) including electronic circuits corresponding to the difference module 600, the synchronization module 200 and the acquisition and analysis device 300. The ground plane 91 is placed on a first side of the support structure 3 which is faced to the antenna conductor 90 and is implemented as a metallic laminate.

In accordance with the example made, the second antenna 2 comprises a respective ground plane, which can be the same ground plane 91 of the first antenna 1, and a second antenna conductor 94. The second antenna conductor 94 is an electrically small antenna, designed to obtain similar electrical characteristics as the first antenna conductor 90 and to be non-resonant in the band of interest. In particular, the second antenna conductor 94 can be a small dipole, loop or spiral antenna. In the embodiment represented in FIGS. 9A and 9B, the second antenna conductor 94 is a patch antenna realized in a second side of the support structure 3 opposite to the first side. In accordance with an example, the patch antenna 94 is realized as an area of copper covering between ¼ and ½ of the support structure 3 also acting as printed circuit board, when a 1.6 mm thick FR4 laminate is used as to make the printed circuit board 3. This provides similar electrical characteristics as the first antenna conductor 90. The printed circuit board 3 is provided with electrical terminals on both sides to contact the first antenna conductor 90 and the second antenna conductor 94.

The embodiment shown in FIGS. 8A and 8B allows a very compact and robust implementation, assures an appropriate complementary radiation pattern and it does not affect the frequency response of the first conductor antenna 90, so not distorting the received partial discharge pulses $S_d$. Due to the presence of the ground plane 91, the radiation pattern of the first and second antenna 1 and 2 is directional as depicted in FIG. 4 so extending toward opposite semi-spaces. This provides an exposition and sensitivity for the partial discharge signal $S_d$ and for the environmental noise $S_n$ of the first antenna 1 and second antenna 2, respectively, which shows good performances.

In accordance with further embodiments, the first antenna conductor 90 can also have another bi-dimensional or three-dimensional shape, such as a planar shape, e.g.: triangle shape, cusp shape or disc shape. The first antenna conductor 90 can be analogous to the antenna described in patent application WO-A-2009-150627.

Figure 9:
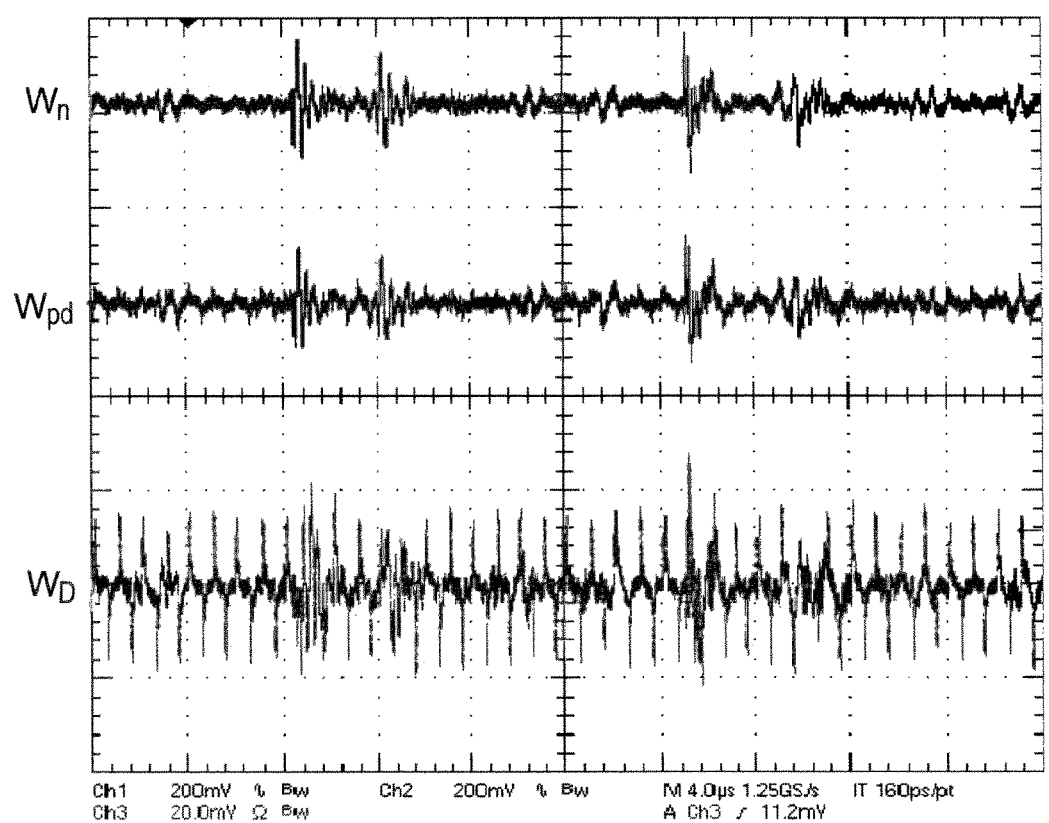
FIG. 9 show experimental results obtained with the partial discharge acquisition system of FIGS. 8a and 8B.

FIG. 9 shows the result of a test performed with a partial discharge acquisition system 500 implemented according to the embodiment described with reference to FIGS. 8A and 8B. The experimental setup employed a simulated partial discharge source, realized with a Tektronix AFG3102 Arbitrary Waveform Generator, set up to generate a regular pattern of impulsive signals (period 1 us, rise/fall time 10/20 ns), connected to a 10 cm long dipole antenna. The first antenna 1 employed for this experiment included a spherical shaped first antenna conductor 90, having a diameter of 7 cm.

The partial discharge acquisition system 500 was placed at about 20 cm from the simulated PD source, pointing the first antenna 1 toward it. The test was performed in a very noisy environment due to the presence of switching converters and motors.

A Tektronix DSO3034 digital oscilloscope (four channels, bandwidth 350 MHz) was connected to the first output terminal 6 and the second output terminal 9 of each of the first and second antennas and at the third output terminal 10 for receiving the difference electrical signal $S_{diff}$.

The three resulting waveforms are showed in FIG. 9: the upper waveform Wn is the output of the second antenna 2, the center waveform Wpd is the output of the first antenna 1, the lower waveform Wd is the output of the partial discharge acquisition system 500. It can be noted that both first and second antennas 1 and 2 receive strong noise bursts (greater than 200 mVpp), considerably larger than the received PD pulses. As expected, PD pulses are not visible in the waveform Wn received from the second antenna 2 (upper waveform) due to its directivity, while they can be recognized in the first antenna waveform Wpd, relatively hided by the noise. It can be noted that noise bursts are detected in the same way by both antennas. As it can be seen the difference waveform Wd taken at the output of the partial discharge acquisition system 500 has instead a greatly improved signal/noise ratio, in fact PD pulses are clearly visible and noise is strongly attenuated (note the 20 mV vertical scale).

With reference to a further embodiment of the partial discharge detection system 500, the first antenna 1 and/or the second antenna 2 can be external to a portable case including the partial discharge detection apparatus 400 and respectively connected to the difference module 600 by the first connection line 5 and the second connection line 9 which are corresponding electrical cables. In accordance with this embodiment, at least one of the first antenna 1 and the second antenna 2 are directional antennas.

Preferably, the first antenna 1 is housed into the case comprising the partial discharge detection apparatus 400 as depicted in FIG. 1 while the second antenna 2 is external to the partial discharge detection apparatus 400 and can be moved to be suitably oriented. According to this preferred embodiment, the second antenna 2 is a directional antenna having, as an example, the second radiation diagram RD2 shown in FIG. 4.

In accordance with this preferred embodiment, the partial discharge detection apparatus 400 is positioned to orient the first antenna 1 towards the electrical object 100 to receive the partial discharge signal $S_d$ so showing a first receiving effective area for the incoming directions of the partial discharge signal $S_d$. The movable second antenna 1 is oriented so as to receive the electromagnetic noise signal $S_n$ and to show a second receiving effective area for the incoming directions of the of the partial discharge signal $S_d$ which is smaller than said first receiving effective area. The first antenna 1 is oriented to be more sensitive to the partial discharge signal $S_d$ than the second antenna 2. The second antenna 2 is oriented to be more sensitive to electromagnetic noise signal $S_n$ than the first antenna 1. The possibility of moving the second antenna 2 allows to reduce the power amount of the partial discharge signal $S_d$ received by the second antenna 2 in comparison with the power amount of the partial discharge signal $S_d$ received by the first antenna 1. The processing of the electrical signals generated by the first antenna 1 and the second antenna 2 is analogous to the one described above with reference to the partial discharge detection apparatus 400 of FIG. 1.

The invention claimed is:

1. A partial discharge detection apparatus, comprising:
 a first antenna configured to receive electromagnetic signals at least partially associated with partial discharges of an electric object and generate a first electrical signal, the first antenna having a first receiving effective area for first receiving directions;
 a second antenna configured to receive electromagnetic noise signals and generate a second electrical signal, the first and second antennas being arranged to cause the second antenna to have a second receiving effective area for said first receiving directions smaller than said first receiving effective area;
 a first processing module configured to receive said first and second electrical signals and to generate an analog difference electrical signal representing a difference between the first electrical signal and the second electrical signal; and
 an acquisition and analysis device of said analog difference electrical signal comprising:
  an analog-to-digital converter structured to convert said analog difference electrical signal into a plurality of corresponding samples,
 wherein:
  the first antenna has a third effective area for second receiving directions different from said first receiving directions; and
  the second antenna has a fourth effective area for the second receiving directions, the fourth effective area of the second antenna being equal to or larger than the third effective area of the first antenna.

2. The apparatus of claim 1, wherein the first and the second antennas are placed on a shared support structure.

3. The apparatus of claim 1, wherein at least one of the first antennas and at least one of the second antennas is a directional antenna.

4. The apparatus of claim 3, wherein both the first antenna and the second antenna are directional antennas.

5. The apparatus of claim 1, wherein:
 the first antenna is arranged so as to have at least 90% of a respective received power in a first radiation pattern in a first half-space; and the second antenna is arranged so as to have at least 90% of a corresponding received power in a second radiation pattern in a second half-space opposite the first half-space.

6. The apparatus of claim 5, wherein:
the first antenna is arranged on the support structure to show maximum values of a respective reception gain for incoming directions lying on the first half-space, and
the second antenna is arranged on the support structure to show maximum values of a respective reception gain for further incoming directions lying on the first half-space.

7. The apparatus of claim 4, wherein the first antenna comprises:
a first antenna conductor; and
a planar conductor configured to operate as ground plane for the first antenna conductor.

8. The apparatus of claim 7, wherein the second antenna further comprises: a second antenna conductor, wherein said planar conductor is configured to operate as ground plane also for the second antenna conductor.

9. The apparatus of claim 7, wherein the first antenna conductor is spherically shaped.

10. The apparatus of claim 8, wherein the second antenna conductor is a patch antenna.

11. The apparatus of claim 10, wherein the first and second antennas are placed on a shared support structure, and said support structure comprises a planar portion comprising:
a first side on which is mounted the first antenna conductor; and
a second side opposite the first side on which said second antenna conductor is mounted.

12. The apparatus of claim 1, wherein the first and second antennas are placed on a shared support structure, and said support structure comprises a printed circuit board comprising said first processing module.

13. The apparatus of claim 12, wherein said printed circuit board comprises:
electrical terminals connected to the first antenna and the second antenna, and
a support element mechanically connecting a first antenna conductor to the printed circuit board.

14. The apparatus of claim 1, wherein said first processing module comprises a difference module configured to generate said difference electrical signal and selected from: an active electronic component, a voltage transformer, and a center-tapped voltage transformer.

15. The apparatus of claim 14, wherein said first antenna is structured to detect by capacitive coupling a synchronization electrical signal representing a trend of an electrical voltage supplied to an electrical object.

16. The apparatus of claim 15, wherein said first processing module further comprises:
a first high pass filtering module connected to the first antenna; and
a second high pass filtering module connected to the second antenna,
wherein the first and second high pass filtering modules are configured to decouple the synchronization electrical signal from said first and second electrical signals.

17. The apparatus of claim 14, wherein said active electronic component comprises:
an operational amplifier in a non-inverting negative feedback configuration and comprising:
a non-inverting terminal configured to receive said first electrical signal;
an inverting terminal configured to receive said second electrical signal; and
an output terminal configured to provide the difference electrical signal representing a difference between the first electrical signal and the second electrical signal.

18. The apparatus of claim 15, further comprising a synchronization module configured for amplifying said synchronization electrical signal and providing an amplified synchronization electrical signal.

19. The apparatus of claim 1, wherein said acquisition and analysis device further comprises:
an acquisition trigger module to select acquisition samples from said plurality of samples;
a memory configured to store the selected acquisition samples; and
a processor structured for generating command signals to be sent to the acquisition trigger module and the memory.

20. The apparatus of claim 18, further comprising a measuring module structured to receive said amplified synchronization electrical signal and provide electrical parameters to a processor.

21. The apparatus of claim 20, wherein said acquisition and analysis device further comprises a transceiver module structured to send and/or receive data and/or command to and/or from an external processor module.

22. The apparatus of claim 1, wherein the first antenna is configured to receive signals having frequency in the range 0.1 Mz to 100 MHz, and the second antenna is configured to receive signals having frequency in the range 0.1 Mz to 100 MHz.

23. A partial discharge detection method, comprising:
positioning a first antenna to have a first receiving effective area for first receiving directions;
receiving by the first antenna electromagnetic signals at least partially associated with partial discharges of an electric object;
generating by the first antenna a first electrical signal corresponding to the received electromagnetic signals;
positioning a second antenna having a second receiving effective area for said first receiving directions smaller than said first receiving effective area, at least one of the first and second antennas being a directional antenna;
receiving by the second antenna electromagnetic noise signals;
generating by the second antenna a second electrical signal corresponding to said received electromagnetic noise signals;
processing said first and second electrical signal to produce an analog difference electrical signal representing a difference between the first electrical signal and the second electrical signal; and
acquiring and analyzing said analog difference electrical signal by performing an analog-to-digital conversion of the analog difference electrical signal obtaining a plurality of corresponding samples,
wherein:
the first antenna has a third effective area for second receiving directions different from said first receiving directions; and
the second antenna has a fourth effective area for the second receiving directions, the fourth effective area of the second antenna being equal to or larger than
the third effective area of the first antenna.

* * * * *